United States Patent
Cao et al.

(10) Patent No.: US 9,645,509 B2
(45) Date of Patent: May 9, 2017

(54) SCANNER MODEL REPRESENTATION WITH TRANSMISSION CROSS COEFFICIENTS

(75) Inventors: Yu Cao, Cupertino, CA (US); Jun Ye, Palo Alto, CA (US); James Patrick Koonmen, Santa Clara, CA (US); Stefan Hunsche, Santa Clara, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 717 days.

(21) Appl. No.: 12/608,460

(22) Filed: Oct. 29, 2009

(65) Prior Publication Data

US 2010/0141925 A1     Jun. 10, 2010

Related U.S. Application Data

(60) Provisional application No. 61/112,913, filed on Nov. 10, 2008.

(51) Int. Cl.
| | |
|---|---|
| G03B 27/32 | (2006.01) |
| G03B 27/54 | (2006.01) |
| G03B 27/52 | (2006.01) |
| G03F 7/20 | (2006.01) |

(52) U.S. Cl.
CPC .......... *G03F 7/705* (2013.01); *G03F 7/70508* (2013.01); *G03F 7/70666* (2013.01)

(58) Field of Classification Search
CPC .. G03F 7/705; G03F 7/70508; G03F 7/70666; G06Q 10/06; H01L 21/02052; H01L 21/02057; H01L 21/67028; H01L 21/6704; H01L 21/67051; H01L 21/67057; Y10S 134/902

USPC ....... 355/53, 55, 67, 77; 378/35; 430/5, 311; 700/708–110, 174, 175, 177; 702/182–185; 716/51
See application file for complete search history.

(56) References Cited

U.S. PATENT DOCUMENTS

| | | |
|---|---|---|
| 5,229,872 A | 7/1993 | Mumola |
| 5,296,891 A | 3/1994 | Vogt et al. |
| 5,523,193 A | 6/1996 | Nelson |
| 5,969,441 A | 10/1999 | Loopstra et al. |

(Continued)

FOREIGN PATENT DOCUMENTS

| | | |
|---|---|---|
| JP | 2000-243690 | 9/2000 |
| JP | 2002-132986 | 5/2002 |

(Continued)

OTHER PUBLICATIONS

Japanese Office Action mailed Aug. 9, 2012 in corresponding Japanese Patent Application No. 2009-244223.
Chris Spence, "Full-Chip Lithography Simulation and Design Analysis—How OPC is changing IC Design," Proc. SPIE, vol. 5751, pp. 1-14 (2005).

(Continued)

*Primary Examiner* — Christina Riddle
(74) *Attorney, Agent, or Firm* — Pillsbury Winthrop Shaw Pittman LLP

(57) ABSTRACT

The present invention relates to a method for simulating aspects of a lithographic process. According to certain aspects, the present invention uses transmission cross coefficients to represent the scanner data and models. According to other aspects, the present invention enables sensitive data regarding various scanner subsystems to be hidden from third party view, while providing data and models useful for accurate lithographic simulation.

19 Claims, 11 Drawing Sheets

(56) References Cited

U.S. PATENT DOCUMENTS

| | | | |
|---|---|---|---|
| 6,046,792 | A | 4/2000 | Van Der Werf et al. |
| 6,701,437 | B1* | 3/2004 | Hoke et al. .................... 726/15 |
| 6,980,872 | B2 | 12/2005 | Kano et al. |
| 7,003,758 | B2 | 2/2006 | Ye et al. |
| 7,587,704 | B2 | 9/2009 | Ye et al. |
| 7,864,301 | B2 | 1/2011 | Socha |
| 2002/0046140 | A1* | 4/2002 | Kano et al. .................... 705/27 |
| 2002/0192578 | A1* | 12/2002 | Tanaka et al. ................. 430/30 |
| 2004/0229133 | A1* | 11/2004 | Socha et al. ..................... 430/5 |
| 2004/0265707 | A1 | 12/2004 | Socha |
| 2005/0096880 | A1* | 5/2005 | Morita et al. ................ 702/189 |
| 2006/0046168 | A1* | 3/2006 | Fukuhara ....................... 430/30 |
| 2006/0230284 | A1* | 10/2006 | Fiske ........................... 713/184 |
| 2007/0061772 | A1 | 3/2007 | Ye et al. |
| 2009/0053621 | A1 | 2/2009 | Socha |
| 2010/0021042 | A1* | 1/2010 | Preil ........................ G03F 1/84 382/144 |
| 2010/0058263 | A1 | 3/2010 | Tyminski et al. |
| 2011/0075124 | A1 | 3/2011 | Socha |

FOREIGN PATENT DOCUMENTS

| | | |
|---|---|---|
| JP | 2004-312027 | 11/2004 |
| JP | 2005-181636 | 7/2005 |
| JP | 2010-517078 | 5/2010 |
| WO | 2007/030704 | 3/2007 |
| WO | 2008/089222 | 7/2008 |

OTHER PUBLICATIONS

Y. Cao et al., "Optimized Hardware and Software for Fast, Full Chip Simulation," Proc. SPIE, vol. 5754, pp. 407-414 (2005).

T. Matsuyama et al., "An Intelligent Image System for ArF Scanner," Proc. SPIE, vol. 6924, pp. 69241S-1-69241S-9 (2008).

Japanese Office Action dated Aug. 2, 2011 in corresponding Japanese Patent Application No. 2009-244223.

Jun Ye et al., "Optical Imaging Theory," Stanford University EE317, Computational Lithography Handout (Spring 2007).

R. L. Gordon, "Exact Computation of Scalar, 2D Aerial Imagery," Proc. of SPIE, vol. 4692, pp. 517-528 (2002).

* cited by examiner

SCANNER MODEL REPRESENTATION WITH TRANSMISSION CROSS COEFFICIENTS

CROSS-REFERENCE TO RELATED APPLICATIONS

The present application claims priority to U.S. Patent Appln. No. 61/112,913, filed Nov. 10, 2008, the contents of which are incorporated herein by reference in their entirety.

FIELD OF THE INVENTION

The present invention relates to a method for simulating aspects of a lithographic process.

BACKGROUND OF THE RELATED ART

Lithographic apparatuses can be used, for example, in the manufacture of integrated circuits (ICs). In such a case, the mask may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the wafer (via the mask).

As noted, microlithography is a central step in the manufacturing of semiconductor integrated circuits, where patterns formed on semiconductor wafer substrates define the functional elements of semiconductor devices, such as microprocessors, memory chips etc. Similar lithographic techniques are also used in the formation of flat panel displays, micro-electro mechanical systems (MEMS) and other devices.

As semiconductor manufacturing processes continue to advance, the dimensions of circuit elements have continually been reduced while the amount of functional elements, such as transistors, per device has been steadily increasing over decades, following a trend commonly referred to as 'Moore's law'. At the current state of technology, critical layers of leading-edge devices are manufactured using optical lithographic projection systems known as scanners that project a mask image onto a substrate using illumination from a deep-ultraviolet laser light source, creating individual circuit features having dimensions well below 100 nm, i.e. less than half the wavelength of the projection light.

This process in which features with dimensions smaller than the classical resolution limit of an optical projection system are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of the projection optics, CD is the 'critical dimension'—generally the smallest feature size printed—and $k_1$ is an empirical resolution factor. In general, the smaller $k_1$, the more difficult it becomes to reproduce a pattern on the wafer that resembles the shape and dimensions planned by a circuit designer in order to achieve particular electrical functionality and performance. To overcome these difficulties, sophisticated fine-tuning steps are applied to the projection system as well as to the mask design. These include, for example, but not limited to, optimization of NA and optical coherence settings, customized illumination schemes, use of phase shifting masks, optical proximity correction in the mask layout, or other methods generally defined as 'resolution enhancement techniques' (RET).

As one important example, optical proximity correction (OPC, sometimes also referred to as 'optical and process correction') addresses the fact that the final size and placement of a printed feature on the wafer will not simply be a function of the size and placement of the corresponding feature on the mask. It is noted that the terms 'mask' and 'reticle' are utilized interchangeably herein. For the small feature sizes and high feature densities present on typical circuit designs, the position of a particular edge of a given feature will be influenced to a certain extent by the presence or absence of other adjacent features. These proximity effects arise from minute amounts of light coupled from one feature to another. Similarly, proximity effects may arise from diffusion and other chemical effects during post-exposure bake (PEB), resist development, and etching that generally follow lithographic exposure.

In order to ensure that the features are generated on a semiconductor substrate in accordance with the requirements of the given target circuit design, proximity effects need to be predicted utilizing sophisticated numerical models, and corrections or pre-distortions need to be applied to the design of the mask before successful manufacturing of high-end devices becomes possible. The article "Full-Chip Lithography Simulation and Design Analysis—How OPC Is Changing IC Design", C. Spence, Proc. SPIE, Vol. 5751, pp 1-14 (2005) provides an overview of current 'model-based' optical proximity correction processes. In a typical high-end design almost every feature edge requires some modification in order to achieve printed patterns that come sufficiently close to the target design. These modifications may include shifting or biasing of edge positions or line widths as well as application of 'assist' features that are not intended to print themselves, but will affect the properties of an associated primary feature.

The application of model-based OPC to a target design requires good process models and considerable computational resources, given the many millions of features typically present in a chip design. However, applying OPC is generally not an 'exact science', but an empirical, iterative process that does not always resolve all possible weaknesses on a layout. Therefore, post-OPC designs, i.e. mask layouts after application of all pattern modifications by OPC and any other RET's, need to be verified by design inspection, i.e. intensive full-chip simulation using calibrated numerical process models, in order to minimize the possibility of design flaws being built into the manufacturing of a mask set. This is driven by the enormous cost of making high-end mask sets, which run in the multi-million dollar range, as well as by the impact on turn-around time by reworking or repairing actual masks once they have been manufactured.

Both OPC and full-chip RET verification may be based on numerical modeling systems and methods as described, for example in, U.S. patent application Ser. No. 10/815,573 and an article titled "Optimized Hardware and Software For Fast, Full Chip Simulation", by Y. Cao et al., Proc. SPIE, Vol. 5754, 405 (2005).

The importance of incorporating scanner information into lithographic modeling is recognized as becoming more and more critical for design applications such as OPC (optical proximity correction). To enable this usage, Nikon, for example, distributes scanner information (Stokes vector, Jones pupil, MSD, etc.) via so-called "scanner signature files". See: T. Matsuyama et al., "An intelligent imaging system for ArF scanner," Proc. SPIE Vol. 6924, 69241S (Mar. 12, 2008).

Scanner data such as Stokes vector and Jones pupil describe aspects of the scanner optics, but need to be interpreted and transformed correctly in order to be used in imaging simulations. Such interpretation requires detailed descriptions of the data format and conventions used in the representation. To achieve the required accuracy, extra care is needed in the numerical algorithms when incorporating such data. This requires a lot of knowledge transfer between the scanner vendor and the OPC vendor. This process is error prone, and hinders continuous improvement of model accuracy.

Moreover, the scanner data may also contain sensitive information related to the scanner design, such as data regarding optical subsystems (e.g. Jones pupil), which scanner and subsystem vendors consider highly proprietary.

As OPC and lithographic simulation becomes more complex, there is a need to incorporate models of more and more scanner subsystems, which constantly need to be calibrated and updated. This becomes a serious and burdensome data management problem.

Moreover, as computational lithography (CL) is generally becoming an increasingly important component of the semiconductor manufacturing process, while accuracy requirements are constantly getting more stringent, there is generally a strong need to make accurate litho models available to a wide range of entities along the design-to-manufacturing chain. Accurate scanner data and physical models enhance significantly the accuracy of the optical part of a CL model, but require in depth understanding of the corresponding subsystem functionality and are therefore not easy to use outside the range of their normally very narrow intended user base. Furthermore, such models or data may not only expose an unnecessary level of detail, but also information that is proprietary and therefore cannot be made widely available. Several key requirements arise from the situation described above: ease of use, encryption or encapsulation of proprietary data, and ease of integration. Ease of integration into a wide range of third party applications at various levels of design data flow in turn requires a certain level of pre-integration to limit the number of date interfaces, allow interface definition with easy-to implement usage protocols for the data presented at the interfaces, and ease of testing or qualification.

Given the concerns discussed above, the goal of making scanner data available for model accuracy improvement would be inherently futile if it were just a best-effort without any means of actually ensuring model quality. Therefore, the present disclosure provides processes that go beyond those of the previously discussed, by embedding the processes into it a large part of the actual modeling, namely the multiple numerical integrations to calculate the TCCs. Various algorithms, including more complex and/or proprietary algorithms, that efficiently and with sufficient accuracy apply the TCCs for aerial image simulation are contemplated for the present disclosure. Not only are scanner data being protected, but also the proprietary TCC generation algorithms with VSP. As a result, the usage and possible integration into $3^{rd}$ party tools becomes very easy, as does qualification/acceptance testing and guaranteeing consistent results across the industry. This overcomes the possibility that as soon as different TCC generation algorithms are applied to the same scanner data, the results would be immediately guaranteed to be different, making wide spread application quite unmanageable.

SUMMARY OF THE INVENTION

According to an aspect of the invention there is provided a method for simulating aspects of a lithographic process, comprising securing data regarding characteristics of a lithographic apparatus, generating mathematical models representing the secured data, and providing the mathematical models to a simulation process while keeping the secured data hidden to the simulation process. According to a further aspect of the invention there is provided a method for simulating aspects of a lithographic process, comprising generating a model for simulating the aspects of the lithographic process, inputting information about a plurality of aspects of the lithographic process to the model, using the model to transform the information into transformed information with a transformation of which the inverse is indeterminate given the transformed information only, wherein the model allows obtaining the simulated aspects based on the transformed information and further information about other aspects of the lithographic process.

The aspects of the invention allow a proper separation of concerns between the scanner vendor and the OPC vendor. All the details of scanner optics remain as knowledge and responsibility of the scanner vendor, without compromising the application of such data in OPC-type products. The encapsulation is achieved via a well-defined mathematical transform, i.e., the TCC calculation algorithm. Basic optical information such as illuminator shape and polarization, Jones pupil, focus blur due to laser bandwidth and/or chromatic aberrations, Jones pupil, etc., can be easily incorporated into the TCCs. Field-dependent effects such as through-slit variations can be captured by providing multiple TCCs, one for each field or slit position.

Imaging simulation can then performed by convolving the mask patterns with the TCC eigenvectors. The imaging simulation will enable the accuracy advantage of using scanner data in RET-type of applications such as OPC and OPC verification. With the addition of predictive scanner models such as pupil predictor, it will also enable process design applications such as SMO (source-mask optimization) and model-based scanner tuning. The invention thus helps protect sensitive information related to a scanner design, while at the same time enabling access to scanner data for the purpose of imaging simulations. Moreover, it helps contain the communication related to such data, including the descriptions, conventions, interpretations, and validations, within the manufacturer of the scanner. Further, it helps the proliferation of scanner data beyond products that exclusively use a particular type of scanner product.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term mask as employed in this text may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning means include:

a programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.

a programmable LCD array. An example of such a construction is given in U.S. Pat. No. 5,229,872, which is incorporated herein by reference.

The invention itself, together with further objects and advantages, can be better understood by reference to the following detailed description and the accompanying drawings.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE PREFERRED EMBODIMENTS

Figure 1:
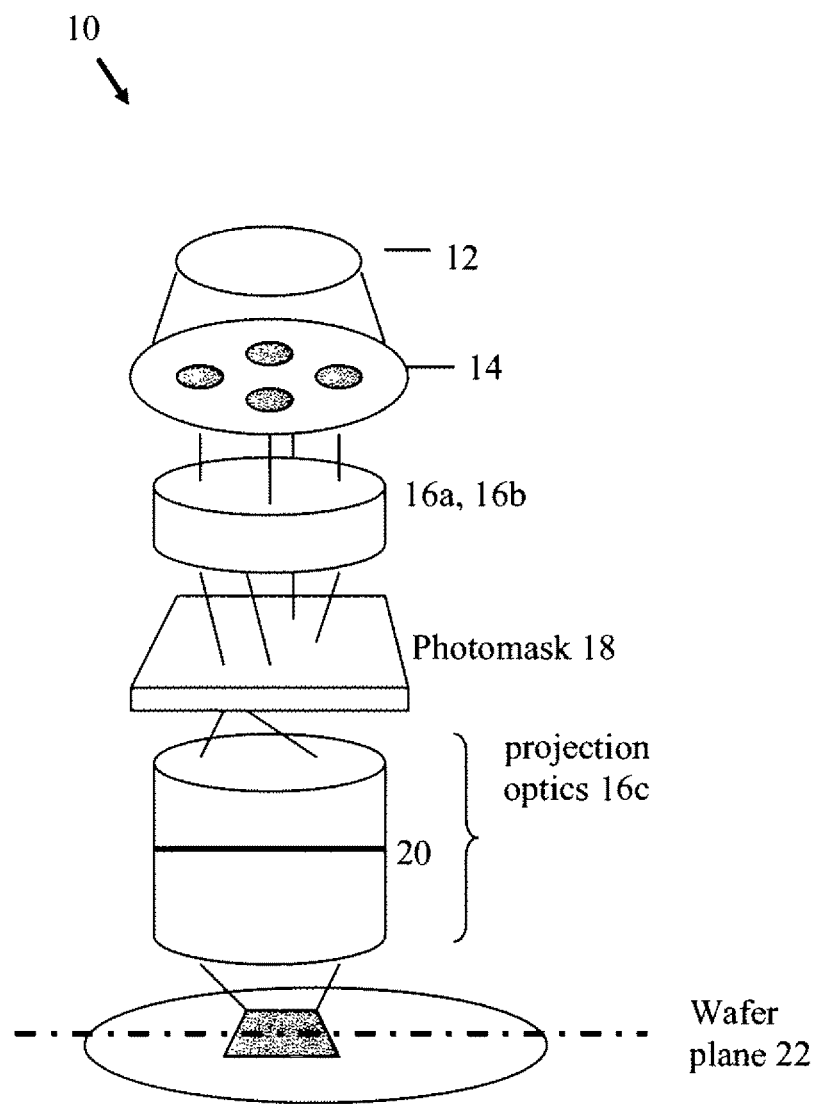
FIG. 1 is an exemplary block diagram illustrating a typical lithographic projection system.

Prior to discussing the present invention, a brief discussion regarding the overall simulation and imaging process is provided. FIG. 1 illustrates an exemplary lithographic projection system 10. The major components are a light source 12, which may be a deep-ultraviolet excimer laser source, illumination optics which define the partial coherence (denoted as sigma) and which may include specific source shaping optics 14, 16a and 16b; a mask or reticle 18; and projection optics 16c that produce an image of the reticle pattern onto the wafer plane 22. An adjustable filter or aperture 20 at the pupil plane may restrict the range of beam angles that impinge on the wafer plane 22, where the largest possible angle defines the numerical aperture of the projection optics NA=sin($\Theta_{max}$).

Figure 2:
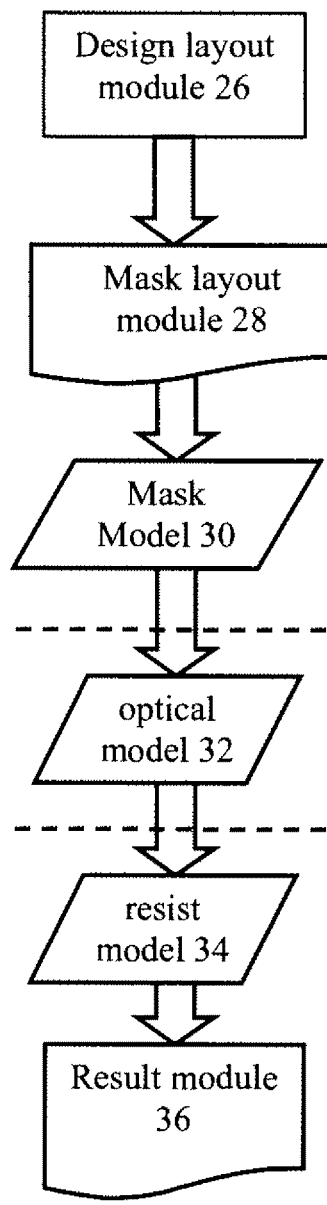
FIG. 2 is an exemplary block diagram illustrating the functional modules of a lithographic simulation model.

In a lithography simulation system, these major system components can be described by separate functional modules, for example, as illustrated in FIG. 2. Referring to FIG. 2, the functional modules include the design layout module 26, which defines the target design; the mask layout module 28, which defines the mask to be utilized in the imaging process; the mask model module 30, which defines the model of the mask layout to be utilized during the simulation process; the optical model module 32, which defines the performance of the optical components of lithography system; and the resist model module 34, which defines the performance of the resist being utilized in the given process. As is known, the result of the simulation process produces, for example, predicted contours and CDs in the result module 36.

More specifically, it is noted that the properties of the illumination and projection optics are captured in the optical model 32 that includes, but not limited to, NA-sigma ($\sigma$) settings as well as any particular illumination source shape (e.g. off-axis light sources such as annular, quadrupole, and dipole, etc.). The optical properties of the photo-resist layer coated on a substrate—i.e. refractive index, film thickness, propagation and polarization effects—may also be captured as part of the optical model 32. The mask model 30 captures the design features of the reticle and may also include a representation of detailed physical properties of the mask, as described, for example, in WO 2007/030704. Finally, the resist model 34 describes the effects of chemical processes which occur during resist exposure, PEB and development, in order to predict, for example, contours of resist features formed on the substrate wafer. The objective of the simulation is to accurately predict, for example, edge placements and CDs, which can then be compared against the target design. The target design, is generally defined as the pre-OPC mask layout, and will be provided in a standardized digital file format such as GDSII or OASIS.

In an aspect of the invention, a software module (also referred to as "virtual scanner pack") is configured to compute transmission cross coefficients (TCCs) from a scanner data file. The scanner data file is typically distributed in a scanner signature file or a scanner systematic signature file, which includes information such as an illuminator pupil-fill or a scanner illumination intensity distribution, a polarization, lens aberration and lens apodization. These scanner systematic signatures may vary noticeably between imaging tool generation/families (i.e., NA 0.92 vs. NA 1.3 scanner generations), and also among scanner vendors. However, signatures of the same type from one manufacturer will strongly resemble each other. Therefore, averaging the measured systematic signatures across multiple tools of the same scanner type will typically provide that scanner type's systematic signature.

Alternatively, machine-type specific performance data of scanner subsystems, e.g. laser beam delivery systems, illuminator optics, diffractive optical elements (DOEs) and projection lens may be determined from rigorous models of these subsystems and then incorporated in a general process or OPC model. This approach may provide larger flexibility for the models to predict tool performance over a wide range of operating conditions, where optical settings such as NA, sigma, and illumination mode may be optimized to improve overall process performance.

The combined information included in the scanner signature files plus process specific parameter settings can be described using transmission cross coefficients (TCCs). A mathematical formulation of the transmission cross coefficients (TCCs) is now provided. In the below scalar model formation, the following notation will be used: x=(x, y) spatial coordinate; k=($k_x$, $k_y$) spatial frequency; S(k)=S($k_x$, $k_y$) source intensity distribution P(k')=P($k_x$, $k_y$) pupil amplitude; M(k')=M($k_x$, $k_y$) Fourier transform of the mask; and I(x)=I(x, y) aerial image intensity.

When the illumination is coherent with a point source on the optical axis, we have $$I(x \mid S(k) = \delta(k)) = \left| \sum_{k'} M(k')P(k')\exp(ik' \cdot x) \right|^2 \quad (1)$$

When the illumination is coherent, but the source point is at $k_0$ (off-axis), the mask transmittance is subjected to a phase modulation $\exp(ik_0 \cdot x)$. The Fourier transform of this phase modulation is $\delta(k-k_0)$. So the Fourier transform of mask with off-axis point source modulation is the convolution between M(k) and $\gamma(k-k_0)$, which is equal to $M(k-k_0)$. So the aerial image intensity is $$I(x \mid S(k) = \delta(k - k_0)) = \left| \sum_{k'} M(k' - k_0)P(k')\exp(ik' \cdot x) \right|^2 \quad (2)$$

In the case of partial coherence using the Abbe Formulation, the source points are mutually incoherent, thus, their contributions to the aerial image add up in intensity $$I(x \mid S(k)) = \sum_{k} S(k) = \left| \sum_{k'} M(k' - k)P(k')\exp(ik' \cdot x) \right|^2 \quad (3)$$

In the case of partial coherence using the Hopkins Formulation, a simple mathematical rearrangement of Eq. ((3)) gives $$I(x \mid S(k) = \sum_{k} S(k) \quad (4)$$
$$= \left| \sum_{k'} M(k' - k)P(k')\exp(ik' \cdot x) \right|^2$$

-continued $$= \sum_k S(k) \sum_{k'} M(k'-k)P(k')\exp(ik'\cdot x)$$

$$\sum_{k''} M^*(k''-k)P^*(k'')\exp(ik''\cdot x)$$

$$= \sum_{k,k',k''} S(k)M(k'-k)P(k')M^*(k''-k)$$

$$P^*(k'')\exp[(ik'-k'')\cdot x]$$

$$= \sum_{k',k_-} M(k')M^*(k'')\exp[i(k'-k'')\cdot x]$$

$$\left(\sum_k S(k)P(k'+k)P^*(k''+k)\right)$$

The last step involves a change of notation, k'−k→k',k''−k→k''. This results in the definition of the transmission cross coefficients, or TCC $$TCC(k',k'') = \sum_k S(k)P(k'+k)P^*(k''+k) \quad (5)$$

which is solely dependent on the optical system, and not on mask patterns (or mask layout of layout of a pattern on a patterning means such as a mask or reticle). So we have $$I(x\mid S(k)) = \sum_{k',k''} M(k')M^*(k'')TCC(k',k'') = \exp[i(k'-k'')\cdot x]. \quad (6)$$

For the case of partial coherence, the TCC Decomposition can be determined. From Eq. ((5)), it is apparent that the TCC is a Hermitian matrix, which can be diagonalized and turned into an eigenseries expansion, $$TCC(k',k'') = \sum_i \lambda_i V(k')V_i^*(k'') \quad (7)$$

where $\lambda_i$ are the eigenvalues (real), and $V_i$ are the eigenvectors (complex). Substituting the above into Eq. ((6)), we get $$I(x) = \sum_{k',k''} M(k')M^*(k'')TCC\exp[i(k',k'')\cdot x] \quad (8)$$

$$= \sum_i \lambda_i \sum_{k',k''} M(k')M^*(k'')V_i(k')V_i^*(k'')\exp[i(k'-k'')\cdot x)$$

$$= \sum_i \lambda_i \left|\sum_{k'} M(k')V_i(k')\exp(ik'\cdot x)\right|^2$$

The eigenseries expansion in Eq. (8) is typically truncated to reduce the amount of computation. The truncation is usually done according to the magnitude of the eigenvalues. The more terms kept in the eigenseries, the better accuracy retained, at the cost of more computation.

For the case of defocus, a phase map on the pupil, which is calculated from the optical path differences between different incidence angles on the wafer side, captures the defocus effect.

The non-paraxial scalar model having high NA effects introduces an obliquity factor on the pupil function (amplitude) for the purpose of enforcing energy conservation, following [3]. The obliquity factor depends on the wave vector angle and involves the magnification factor (typically 0.25 for lithography systems) for solid angle calculations.

Pupil aberration may be specified using Zernike coefficients. The Fringe Code convention is used, as would be apparent.

A vector model that includes vector diffraction and source polarization can be developed based on the formulation above. Following [4], the diffracted amplitude is calculated as a function of source side wave vector (k) and polarization ($E_x$, $E_y$), and exit pupil wave vector (k') and polarization (TE, TM). In this case, the polarization from the z-component ($E_z$) can be ignored since $E_z$ is negligible due to the small source side numerical aperture.

Wafer side film stack and polarization effects can also be determined. Following [5], we can compute the electric field intensity ($|E^2|$) distribution in the resist film. This step converts the exit pupil wave vector (k) and polarization (TE, TM) into image side polarization ($E_x$, $E_y$, $E_z$), from which the field intensity is derived.

Vector pupil filter and aberration effects can also be determined. A user-defined vector pupil filter map over the pupil coordinates may be specified. Each element of the pupil filter map is a complex-valued matrix, loosely known as a Jones matrix. This matrix describes the amplitude change, phase change, and rotation of the polarization vectors. An important difference from the conventional Jones matrix concept is that the 2×2 matrix for a given pupil position does not have to be Hermitian, as is the case for physical polarizing devices. Hermiticity is enforced at a higher level, via the bilinear TCC matrix.

In the case of immersion, both the vector diffraction and film stack calculations are modified to accommodate free space medium with n>1.

In the case of mask 3D effects, rigorous finite-difference time-domain (cf. [6]) simulation maybe used to account for the mask's topography scattering effect to the EM wave.

In the case of model-apply flow, both the mask and aerial image are represented as sampled image pixel values. There are some important differences between the two. First of all, in terms of mask rasterization, the mask causes an amplitude modulation to the incidence light wave. The physical mask has sharp edges, and the first-level mathematical representation is polygons with different transmittance and phase.

The polygons are converted to a high-resolution image then down-sampled (with anti-aliasing filtering) to the primary pixel size. The transmittance and phase are applied to the high-resolution image. The final mask image at the primary pixel size is a complex-valued image. In practice, binary and phase shift masks with only 0 and π phase shift can be represented using real values.

Second, in terms of aerial image computation, the physical quantity represented by an aerial image is of course intensity rather than amplitude. For this reason, the aerial image is real instead of complex. The aerial image is also intrinsically band-limited, unlike the mask.

To apply an n term TCC to a mask image, one forward Fourier transform (using FFT) and n backward Fourier transforms are required. The results of the backward Fourier transforms are squared and summed, to give the final aerial image intensity.

Sampling and interpolation can also be performed. From Eq. ((4)), we see the pass-band of the aerial image is determined entirely by the pupil function, and is not related to the source shape. The pass-band is at 2NA/λ, with the factor of 2 coming from the conversion from amplitude to intensity. It is also easy to see by considering a simple case of two-beam interference at angles ±NA.

An interesting point arises if we consider the pass-band of the aerial image computed from the decomposed TCC or convolution kernels approach. From Eq. (5), the TCC has support in both k' and k" up to $(1+\sigma)NA/\lambda$, so one would expect the eigenvectors to have support up to $(1+\sigma)NA/\lambda$ as well (which is true). Then from Eq. (8), the pass-band of the result of the sum should be $2(1+\sigma)$ NA/2, not $2NA/\lambda$ from the physical (and Abbe) considerations. This discrepancy in fact diminishes as more terms are kept in the summation, as the extraneous frequency components from different kernels cancel each other better. This pass-band discrepancy gives an intuitive way to understand why more kernels are required for higher a values, as exact cancellation of the high frequency components becomes more difficult. It also suggests another benefit of keeping more convolution kernels after the TCC diagonalization.

The critical sampling frequency required by the aerial image is $4NA/\lambda$, being twice the aerial image pass-band (Shannon sampling theorem). Typically, a 20% to 30% extra frequency margin (oversampling) is used on top of the critical frequency to ensure good interpolation accuracy. The inverse of the final aerial image sampling frequency gives the aerial image pixel size, also called the primary pixel size. As an example, at $\lambda=193$ nm, NA=0.85, the critical sampling frequency is equal to $\lambda/(4NA)=56.76$ nm. In reality, 40 nm is probably the suitable aerial image pixel size.

After the forward FFT is carried out, the TCC eigenvectors are multiplied by the mask spectrum. The high frequency components may be zero-padded, such that the result of the backward Fourier transform (aerial image) becomes more densely sampled. The aerial image may also be interpolated using filters in the space domain.

The Hopkins' method, as discussed above, is based on the exchange of the integration order over the point source contributions and the diffraction amplitudes, which has the advantage that a given optical system with fixed illumination, numerical aperture, defocus, and other aberrations can be described with the so-called transmission cross coefficients (TCCs). The TCCs need to be calculated just once. Thereafter they can be reused for repeated aerial image simulations of different mask patterns printed by the same optical system.

Modeling the aerial imaging path through the projection optics and under the designed illumination scheme will now be discussed. The physical imaging model has been well established in optical science, either scalar or vector imaging model may be used. Vector model is becoming more important as the optical lithography moves to high-NA systems (high NA generally refers to NA larger than 0.6). Over the past decade, there have been various techniques developed to speed up the computation.

One example is to decompose the total imaging system into a series of coherent imaging systems with decreasing importance, i.e., smaller and smaller eigenvalues of a matrix called Transmission Cross Coefficients (TCCs) which is a matrix defined by the projection and illumination optics but independent of the mask pattern itself. The decomposed coherent systems are often called as eigen-systems. Depending on the accuracy requirement, various numbers of eigen-systems can be included. The majority of the aerial image computations may employ Fast Fourier Transforms (FETs), both forward and backward, to generate the aerial image. Because a diffraction-limited coherent optical imaging system may be readily characterized as a series of Fourier Transforms, it may be advantageous to employ FFTs to generate the aerial image of the design. All these transforms, when applied on pixel based image, may be regular pixel-based computations.

Further, the aerial image may be generated by using, for example, the bitmap image of a polygon design database as modified by additional processing (for example, anti-aliasing filtering techniques and/or mask error modeling).

During the aerial image generation/computation, the wafer-surface resist stack parameters (for example, thickness, BARC and/or refractive index) may be incorporated into the TCC equations. Various non-mask RET technologies may also be incorporated, for example, the off-axis illumination and pupil filtering, as part of the TCC computation equations. Further, the imperfections in optics, for example, aberration and/or light scattering, may also be incorporated in the aerial imaging equations, by accordingly modifying the pupil filtering from ideal case. Moreover, basic optical information such as illuminator shape and polarization, Numeric aperture, Jones pupil, focus blur (for instance due to laser bandwidth or/and chromatic aberrations) and defocus can be easily incorporated into the transmission cross coefficients. Further, field-dependent effects such as through-slit variations can be captured by providing multiple TCCs, one for each field or slit position. Thus the transmission cross coefficients can be based on the combination of various kinds of characteristics of the lithographic process.

The software module of the present invention computes the transmission cross coefficients (TCCs) from scanner data. The scanner data includes information related to the arrangement and configuration of the optical systems of the lithographic apparatus that will be hidden from the final user. The details of the optical systems will remain protected, while at the same time, enabling access to scanner data for the purpose of imaging simulations. This process helps maintain information related to scanner data including descriptions, conventions, interpretations and validations confidential to only the scanner designer. The transmission cross coefficients (TCCs) are a mathematical entity that encapsulates all the details of the scanner data (optics), and form a transfer function for the optical system which enables imaging simulations. Note that the TCC's are calculated based on a summation over different values of the spatial frequency k of a product of 3 terms (the source intensity distribution S(k) and the pupil amplitude P(k') (see equation 5). By transferring none of these terms to another party (the final user), one effectively conceals these terms (the source intensity distribution S(k) and the pupil amplitude P(k')) for the other party, as that party will not be able to extract the source intensity distribution S(k) and the pupil amplitude P(k') by reversing the calculation. There is simply a lack of information to do that or in other words the equations to solve to obtain the terms (source intensity distribution S(k) and the pupil amplitude P(k')) from the TCC's (equation 5) or their eigen vectors and eigenvalues (equation 7). Still the other party (the final user) is still able to calculate the intensity based on the TCC's (equation 6) or their eigenvalues and eigen vectors (equation 8) when combined with information on the mask. Thus the invention makes use of the separation in the model between two sets of information being the information expressed in transformed form by the TCC's (such as illuminator shape, illuminator polarization, Jones pupil and focus blur (caused by laser bandwidth and/or chromatic aberration of a projections system) and further information such as on the layout of a pattern on a patterning means. The result of the transformation is independent of the further information. The transformed information and the further information (as said for instance on the layout of the pattern on the patterning means) can be combined in a later step by another party (the final user). Note that the final user also does not have to provide information on the layout of the pattern on the patterning means (the further information) to the party performing the transformation (typically the party that wants to conceal other information on the process such as information on a photolithographic apparatus) in order that the simulation can be completed. Typically such information is highly secret as well. Apart from that, exchanging information on the layout of a pattern on a patterning means requires a large transmission time (as such information is typically quite extensive) and the final user (i.e. the party with the information on the layout of a pattern on a patterning means) keeps control over the time required for the final steps in the simulation as he performs them himself. In an embodiment however, the further information comprises an illuminator setting (such as a sigma) and the transformation depends on the further information. In this embodiment of course a part of the information of the final user is share with the party performing the transformation. However, still the information can be conseated from the final user by only providing the transferred information to the final user. The simulation is then complete by combining the transformed information with further information or at least a part of the further combination.

Figure 3A:
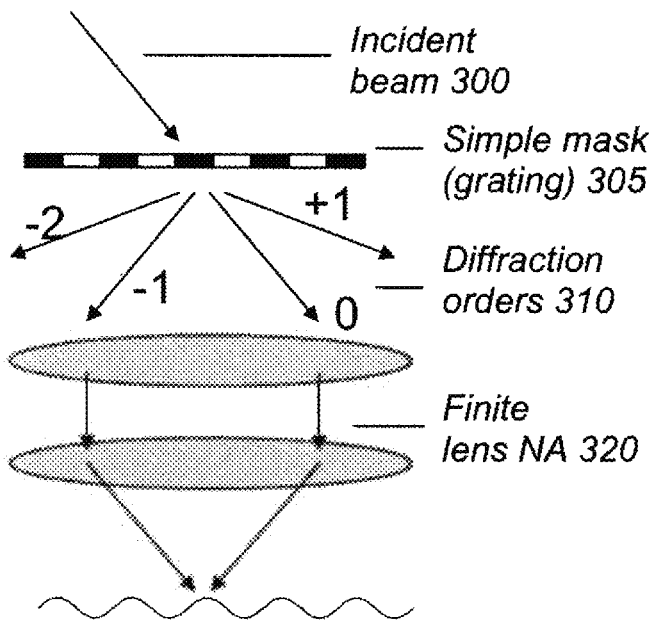
FIGS. 3A and 3B shows a graphical illustration of the transmission cross coefficients (TCCs).
Figure 3B:
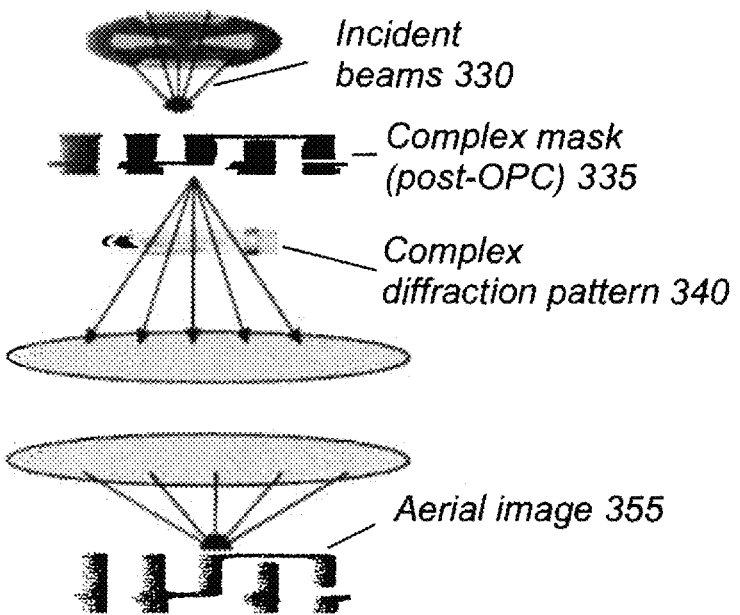

A graphical illustration of the transmission cross coefficients (TCCs) are shown in FIGS. 3A and 3B. FIG. 3A shows a view of the interaction of a single incidence beam as it passes through various components of a simplified patterning structure of a lithographic apparatus. A single incidence beam 300 is directed onto a simple mask 305. The mask 305 in this case is a diffraction grating. The mask 305 diffracts the incidence beam 300 into a plurality of diffraction orders 310. The first two orders of diffraction (±1, ±2) are shown for simplicity. The zeroth-order (undiffractive) is not shown. Optical elements, such as lens 315 and 320 capture the diffracted radiation and focus the radiation having the mask pattern formed in its cross-section to create an aerial image 325. The amount of diffractive orders captured by the lens 320 is determined, in part, by the numeric aperture of the lens.

FIG. 3B differs from FIG. 3A by showing a more realistic interaction of incident radiation through various components of a patterning structure of a lithographic apparatus. Multiple incident beams 330 from a variety of incident angles are directed onto a mask 335. The mask 335 is a complex mask that has undergone post optical proximity correction (post-OPC). A complex diffraction pattern 340 is then created by virtue of the incident beams interacting with the mask 335. Optical elements, such as lens 350 capture the diffracted radiation, where many 2-beam interactions contribute to produce the aerial image 355.

A transmission cross coefficient (TCC) matrix sums up all the mutual 2-beam interactions arising from an extended source, as in FIG. 3B, to form the aerial image. The terms of the TCC matrix contain all information of the source map and the projection optics, while being independent of the mask pattern. The TCC matrix is pre-computed when a model is generated, so that the integration over all source points is already done when the model is applied to a specific mask. This enables fast full-chip lithographic simulation.

Figure 4:
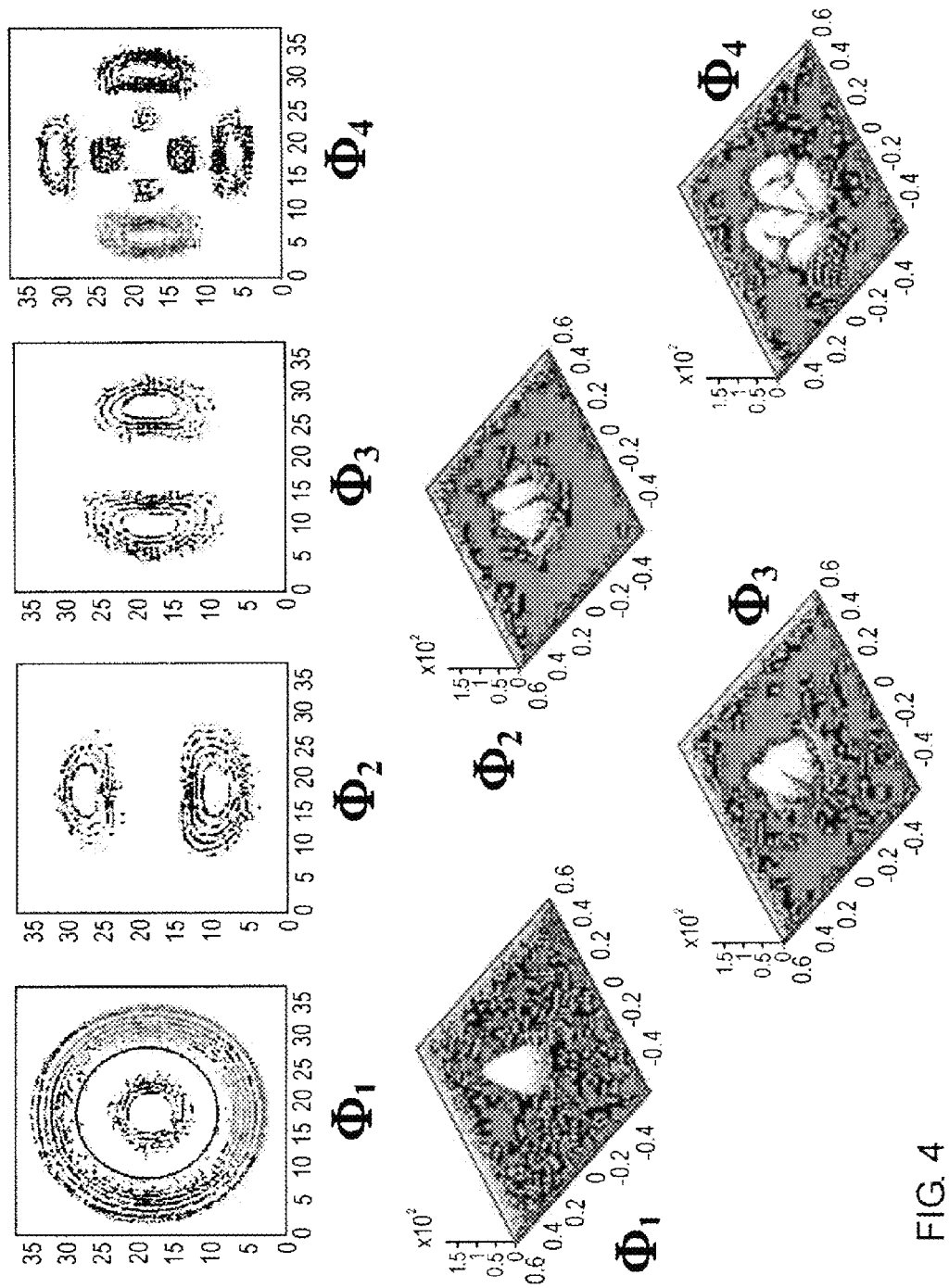
FIG. 4 shows another graphic representation of the transmission cross coefficients (TCCs).

FIG. 4 shows another graphic representation of the transmission cross coefficients (TCCs). The TCCs are decomposed into Eigenfunctions $\Phi_m$, i.e., a set of pupil functions with different distribution symmetry and different weight. As shown, Eigenfunctions $\Phi_1$, $\Phi_2$, $\Phi_3$ and $\Phi_4$ represent pupil functions in a frequency domain. A Fourier transform, in real space, of the Eigenfunctions $\Phi_m$ results in a corresponding convolution kernel $\phi_m$. In the case of a set of four Eigenfunctions ($\Phi_1$, $\Phi_2$, $\Phi_3$ and $\Phi_4$), a corresponding set of four convolution kernels ($\phi_1$, $\phi_2$, $\phi_3$ and $\phi_4$) represent the mask image in the spatial domain. The aerial image results from convolution of the mask image with the weighted sum of the kernels $\phi_m$. The weights are determined by the eigen values and the mask (see equation). Although only four Eigenfunctions are shown in FIG. 4, several dozen or several hundred Eigenvectors are used in preferred embodiments for practical situations, chosen as described below.

In an aspect of the invention, the software module calculates the transmission cross coefficients (TCCs) according to the following manner. The illuminator pupil based on the source intensity distribution, S(k), and the projection pupil function (finite numeric aperture (NA), Jones pupil, aberrations, etc.) based on the pupil amplitude are both rasterized and sampled. A numeric integration of Eq. ((5)) is performed to determine the TCC matrix elements. An Eigenvalue decomposition according to Eq. ((8)) is performed and a select number (N) dominant Eigenvectors, having the largest Eigenvalues, is chosen. The selected dominant Eigenvectors are then output to a file, such as an XML file format.

In one aspect of the invention, the software module is configured to compute the transmission cross coefficients (TCCs) based on an automated Diffractive Optical Element (DOE) exchanger. This DOE exchanger allows users to select from a library of standard illumination shapes, which can increase their depth of focus and exposure latitude while reducing mask error factors for the most advanced layers of integrated circuits. The standard illumination shapes include on-axis and off-axis light sources such as annular, quadrupole (i.e., quasar) and dipole arrangements.

Figure 5:
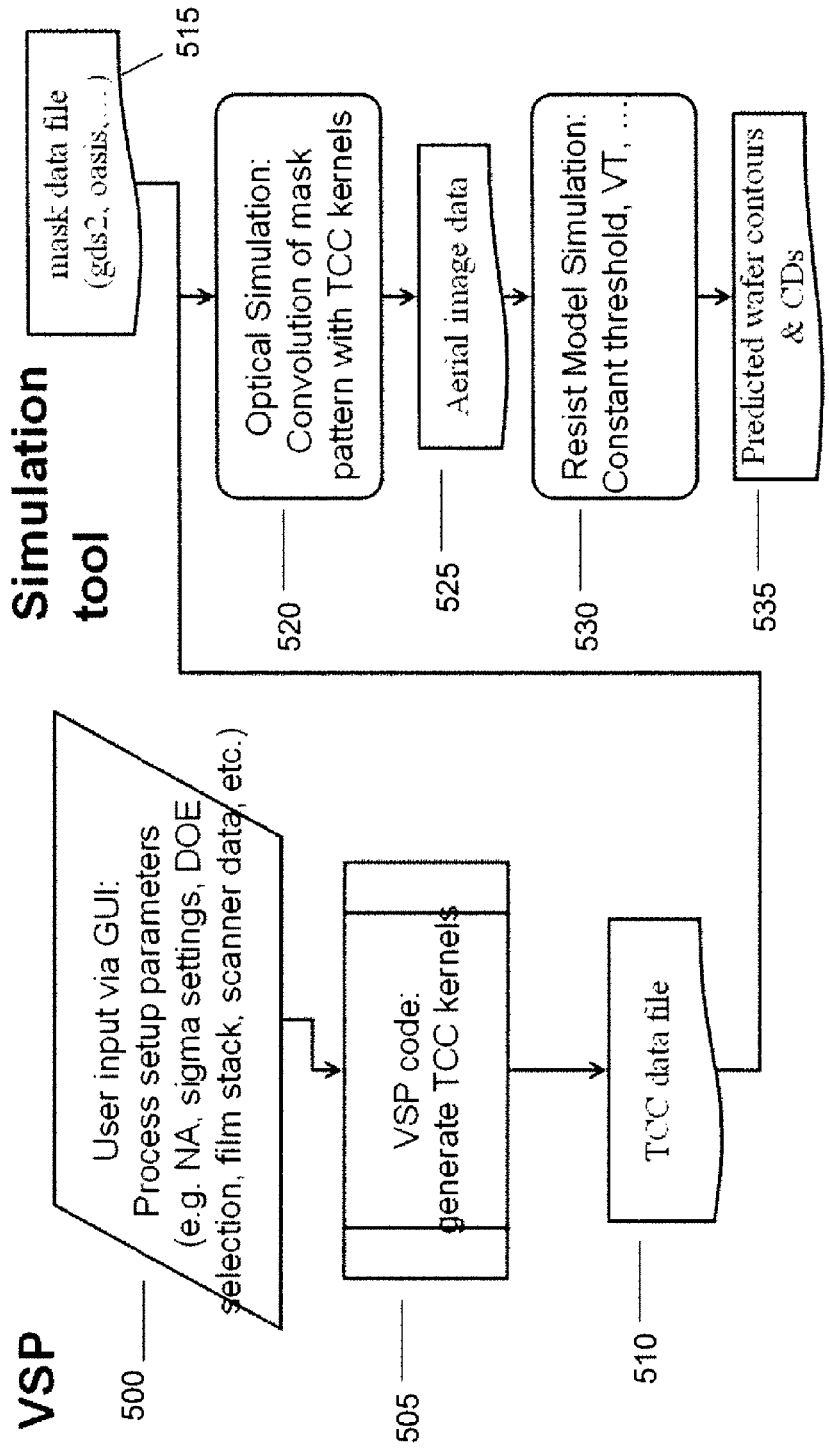
FIG. 5 shows a process flow for individual model generation and model use in accordance with an aspect of the invention.

FIG. 5 shows a process flow for individual model generation and model use in accordance with an aspect of the invention. The process begins at 500 where a user inputs data into a computer through a computer interface, such as a graphic user interface. The inputs include process setup parameters such as numeric aperture, sigma settings, diffractive optical element selection, film stack, scanner type and specific scanner data. The process continues at 505 where virtual scanner pack software module operating on the computer is used to generate a set of transmission cross coefficient kernels (further described below in reference to FIG. 6). The process continues at 510 where the generated transmission cross coefficient kernels are arranged in a transmission coefficient data file. A simulation module operating on the computer is configured to receive the transmission coefficient data file and a mask data file, which could be generated separately, at 515. The simulation module, at 520, proceeds to perform an optical simulation using the transmission coefficient data file and the mask data file by performing a convolution operation of the mask pattern with the generated transmission cross coefficients. The process continues at 525 where the results of the convolution operation is an aerial image data. The aerial image data is combined with a resist model simulation at 530 to simulate a predicted wafer contours and critical dimensions, at 535.

Figure 6:
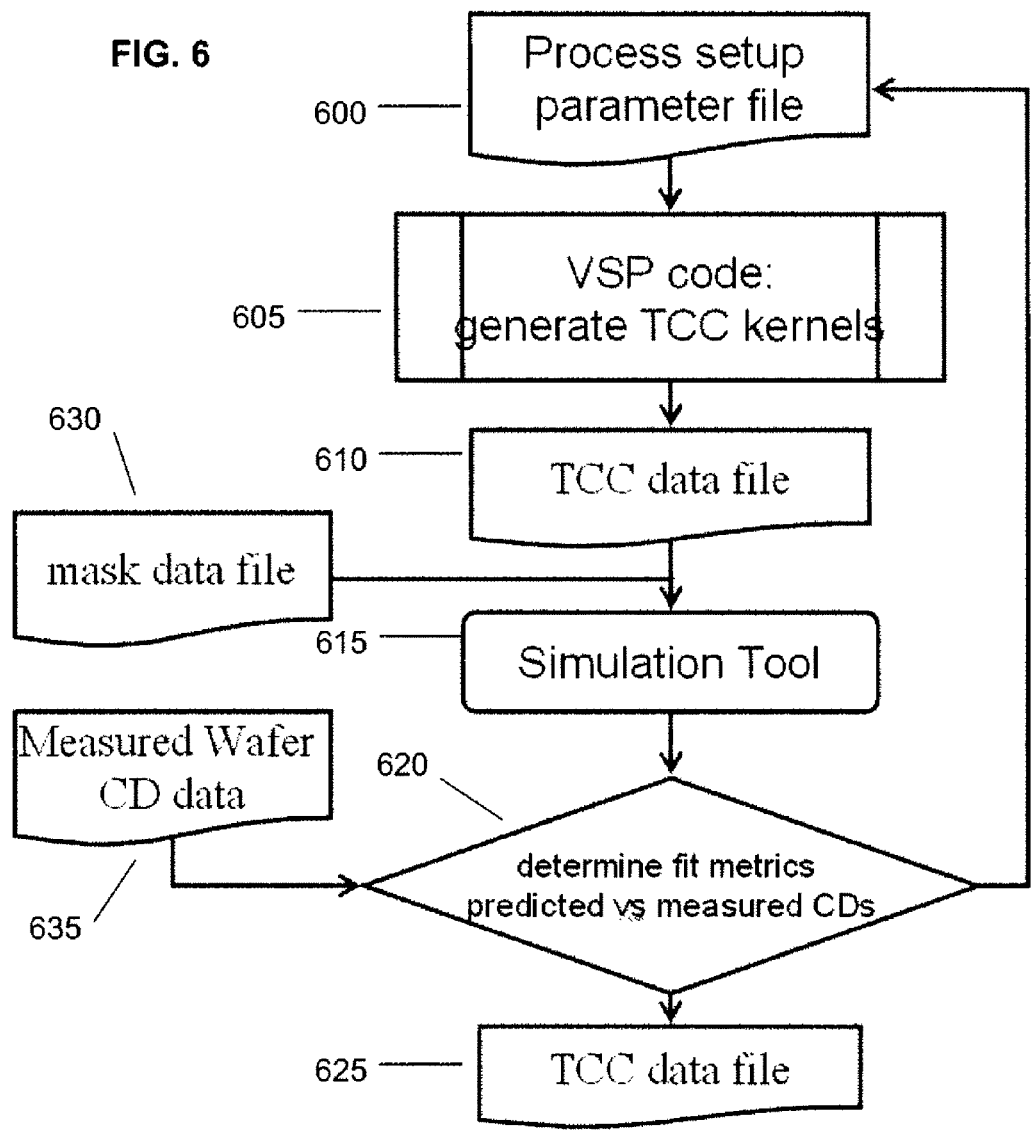
FIG. 6 shows a process flow for a lithographic model calibration in accordance with an aspect of the invention.

FIG. 6 shows a process flow for a lithographic model calibration in accordance with an aspect of the invention. The process begins at 600 where a process setup parameter file that includes information such as numeric aperture, sigma settings, diffractive optical element selection, film stack and scanner data is generated. Although not shown in the Figure, a simulation tool could be included to determine best parameter values for resist model parameters. The process continues at 605 where the virtual scanner pack software module generates the transmission cross coefficient kernels from the process setup parameter file. The process continues at 610 where the generated transmission cross coefficient kernels are arranged in a transmission coefficient data file. A simulation module operating on the computer is configured to receive the transmission coefficient data file and a mask data file 630, which could be generated separately, at 615. The process continues at 620 where the predicted critical dimensions generated by the simulation of the simulation module are compared with critical dimension data 635 from a measured wafer. If the comparison results in an insufficient fit, the process proceeds back to the beginning at 600, where the process setup parameter are modified. The modifications can include changes to one or more parameters such as defocus amount and the annular illumination as represented by $\sigma_{in}$ and $\sigma_{out}$. If the comparison between the simulated and measured critical dimensions results in a sufficient fit, then the transmission cross coefficient file outputted or stored for later use at 625.

Figure 7:
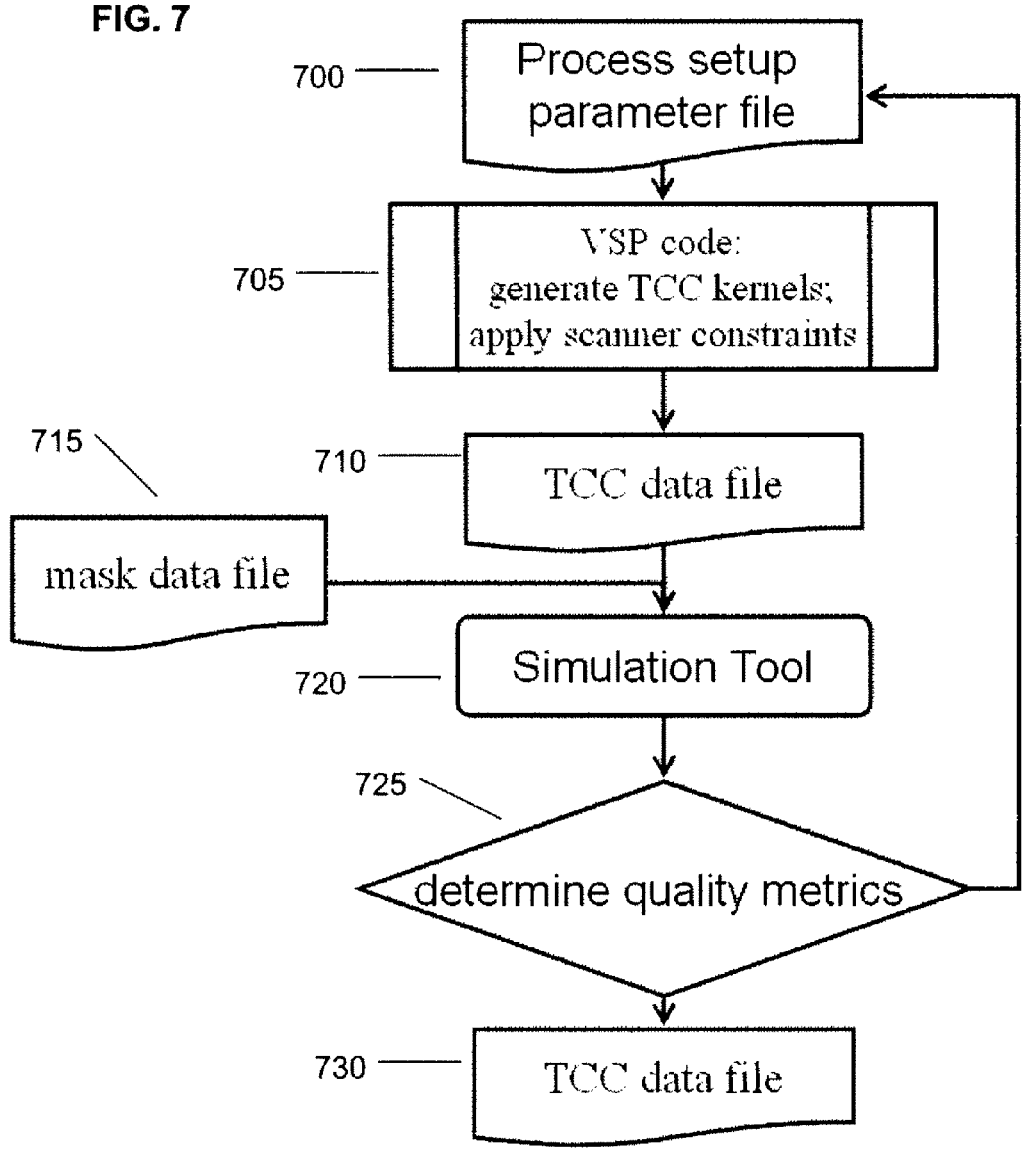
FIG. 7 shows a process flow for a lithographic process optimization in accordance with an aspect of the invention.

FIG. 7 shows a process flow for a lithographic process optimization in accordance with an aspect of the invention. The process begins at 700 where a process setup parameter file that includes information such as numeric aperture, sigma settings, diffractive optical element selection, film stack and scanner data is generated. The process continues at 705 where the virtual scanner pack software module generates the transmission cross coefficient kernels from the process setup parameter file. The software module also applies scanner constraints, such as parameter value limits. The process continues at 710 where the generated transmission cross coefficient kernels are arranged in a transmission coefficient data file. A simulation module operating on the computer is configured to receive the transmission coefficient data file and a mask data file, which could be generated separately, at 715. The process continues at 720 where the simulation module performs a simulations based on the inputted transmission cross coefficient data file and the mask data file. The process continues at 725 where the simulation generates quality metrics. The process quality metrics are based on predicted contours, such as normalized image log slope (NILS), mask error factor (MEF) and process window (PW). If the quality metrics are determined to be of an insufficient quality, the process proceeds back to the beginning at 700, where the process setup parameter are modified. The modifications can include changes to one or more parameters such as numeric aperture and the annular illumination as represented by $\sigma_{in}$ and $\sigma_{out}$. If the quality metrics are determined to be sufficient, then the transmission cross coefficient file outputted or stored for later use at 730.

Figure 8:
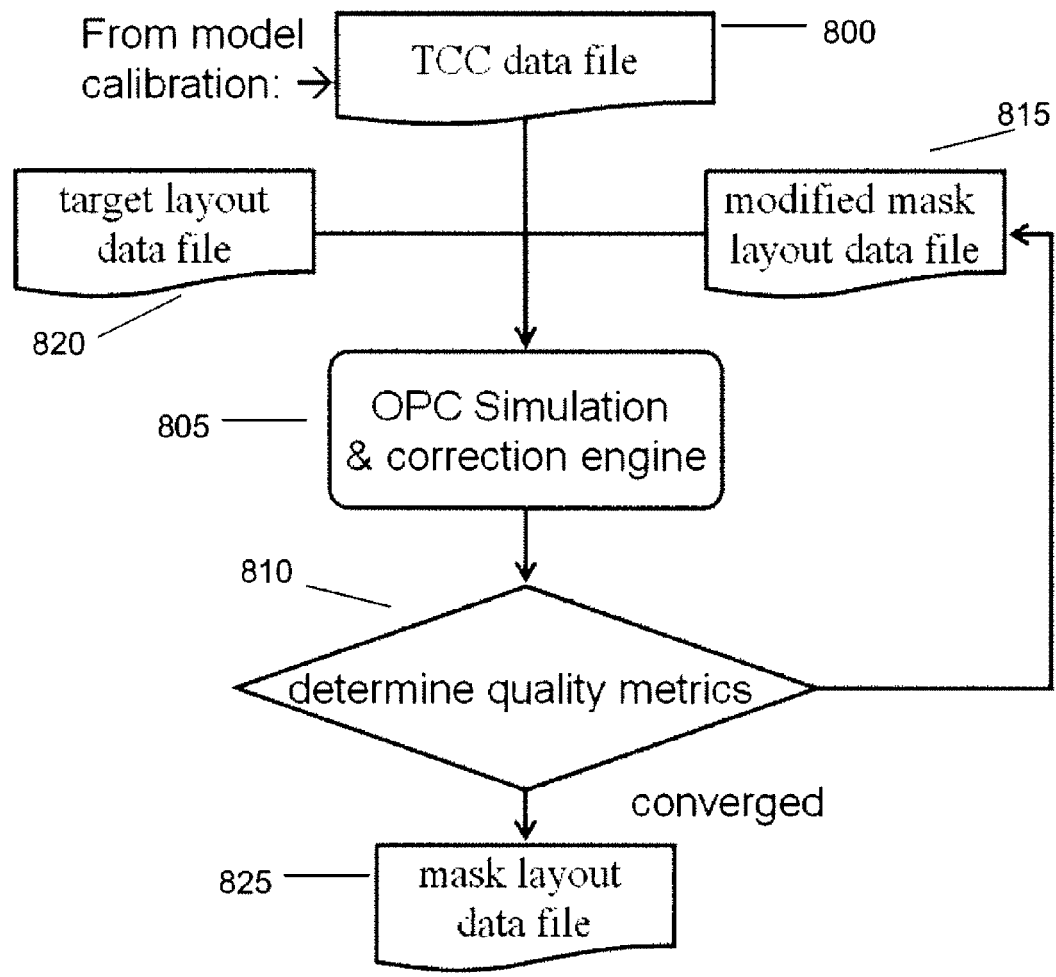
FIG. 8 shows a process flow for optical proximity correction using the transmission cross coefficient data file from FIG. 6 in accordance with an aspect of the invention.

FIG. 8 shows a process flow for optical proximity correction using the transmission cross coefficient data file from FIG. 6 in accordance with an aspect of the invention. The process begins at 800 where the calibrated transmission cross coefficient data file is provided. A target layout data file and a mask layout data file is provided to a optical proximity correction simulation and correction engine at 805. At 810, contour quality metrics of predicted contours are compared with target layout polygons, such as edge placement error (EPE) statistics. If the comparison results in insufficient convergence, the mask layout is modified at 815 and combined with a target layout data file at 820 to be input into the optical proximity correction simulation and correction engine at 805. If the comparison results in a satisfactory convergence, then the mask layout data file is outputted at 825.

In another aspect of the invention, the software module configured to compute the transmission cross coefficients (TCCs) based on an automated Diffractive Optical Element (DOE) exchanger and a Source-Mask Optimization (SMO). The SMO co-optimizes the illumination and reticle pattern for a specific design fragment (clip), while obeying the constraints of the DOE and mask fabrication processes. The optimization process uses a given source shape as input for the model based OPC mask revision and then cycles the process until the combination giving the optimum focus exposure condition appears. Optimization metrics include the overlapping process window for multiple clips and mask error enhancement factor (MEEF).

Figure 9:
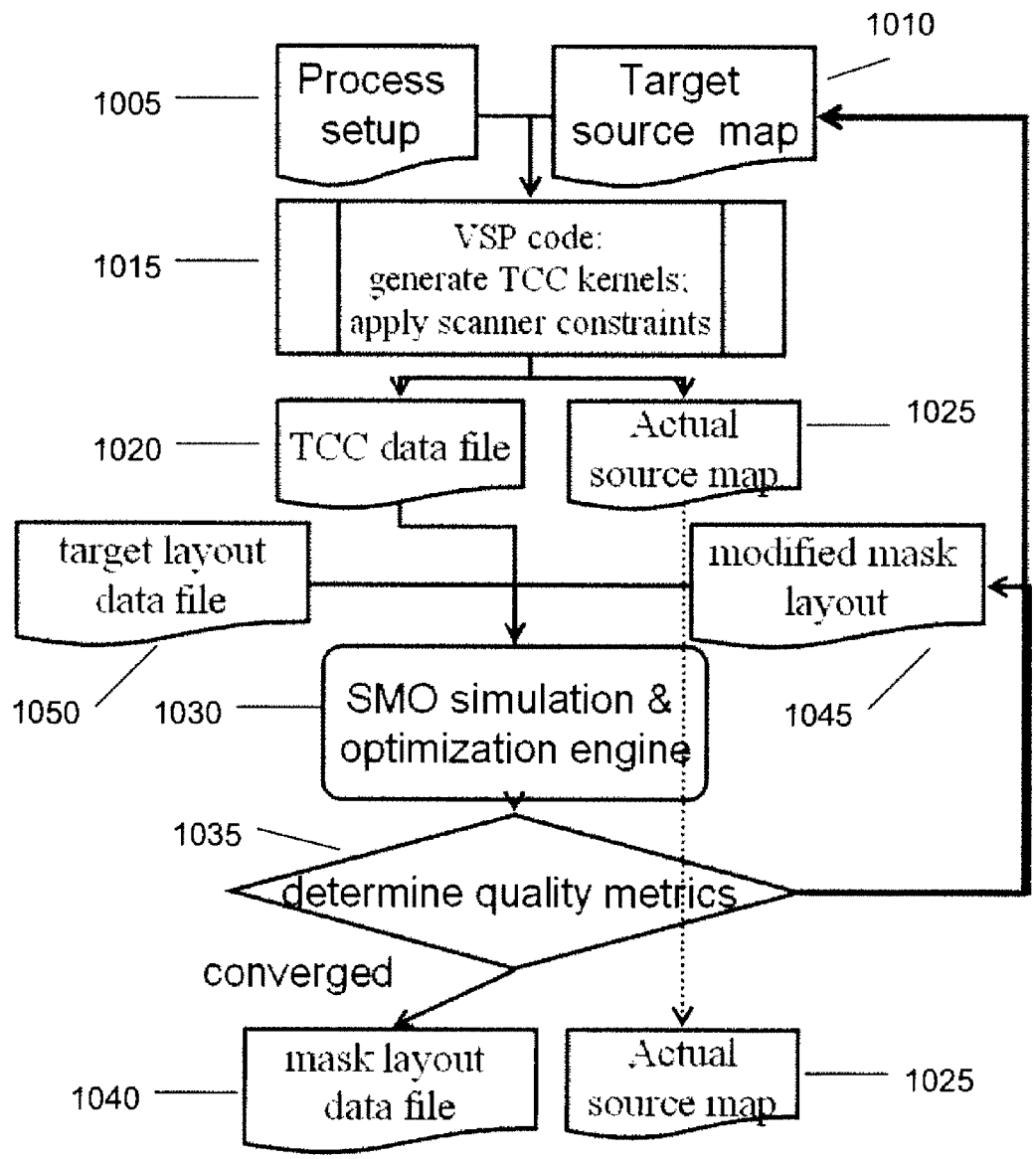
FIG. 9 shows a process flow for source and mask co-optimization (SMO) in accordance with an aspect of the invention.

FIG. 9 shows a process flow for source and mask co-optimization (SMO) in accordance with an aspect of the invention. A process setup 1005 is combined with a target source map 1010 and input into a virtual scanner pack software module 1015. The software module 1015 generates transmission cross coefficient (TCC) kernels and applies scanner constraints on parameter value limits and source map rendering. A TCC data file 1020 is output from the software module 1015 and is input into a source-mask simulation and optimization (SMO) engine 1030. An actual source map 1025 is also output from the software module 1015. Quality metrics 1035 are determined from the SMO engine 1015, and if the quality metrics converge, then a mask layout data file is outputted, at 1040. Also, the actual source map 1025 is outputted. The quality metrics are based on the predicted contours of the target layout data file 1050 and include normalized image log slope (NILS), mask error factor (MEF), and process window (PW). If the quality metrics do not converge, a mask layout and target source map are modified at 1045 and the process repeats at 1010.

Figure 10:
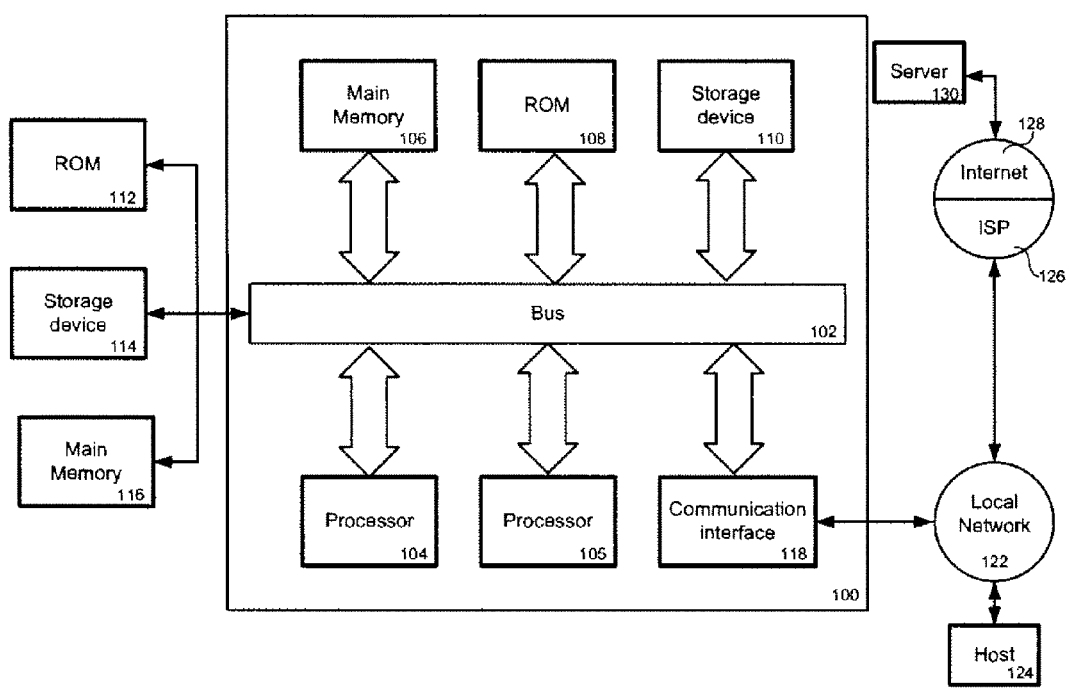
FIG. 10 is a block diagram that illustrates a computer system which can assist in the implementation of the simulation method of the present invention.

FIG. 10 is a block diagram that illustrates a computer system 100 which can assist in implementing the lithographic simulation methods disclosed herein. Computer system 100 includes a bus 102 or other communication mechanism for communicating information, and a processor 104 coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, portions of the simulation process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 11:
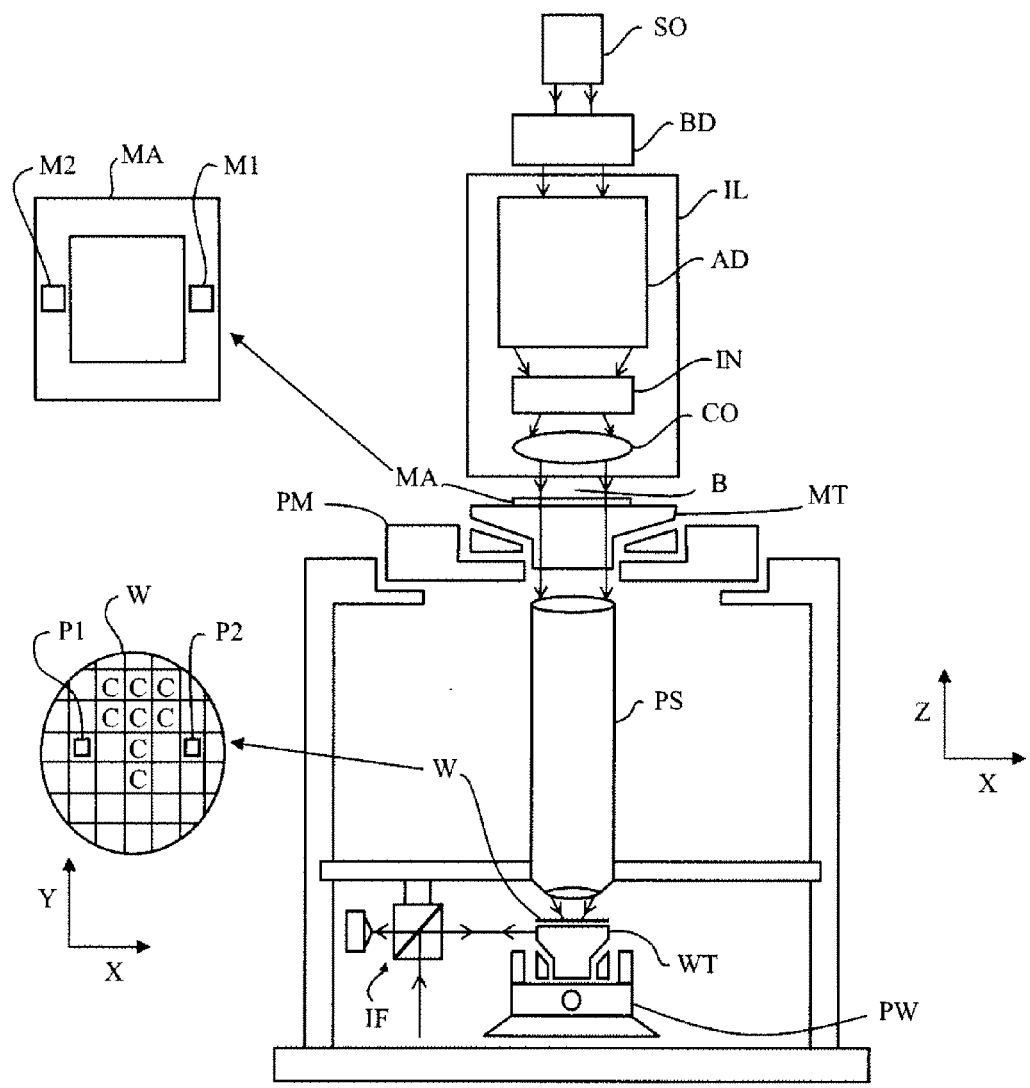
FIG. 11 schematically depicts a lithographic projection apparatus suitable for use with the method of the present invention.

FIG. 11 schematically depicts an exemplary lithographic projection apparatus for which lithographic processing can be simulated utilizing the process of present invention. The apparatus comprises:

a radiation system Ex, IL, for supplying a projection beam PB of radiation. In this particular case, the radiation system also comprises a radiation source LA;

a first object table (mask table) MT provided with a mask holder for holding a mask MA (e.g., a reticle), and connected to first positioning means for accurately positioning the mask with respect to item PL;

a second object table (substrate table) WT provided with a substrate holder for holding a substrate W (e.g., a resist-coated silicon wafer), and connected to second positioning means for accurately positioning the substrate with respect to item PL;

a projection system ("lens") PL (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 11 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or $F_2$ lasing). The current invention encompasses at least both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 11. However, in the case of a wafer stepper (as opposed to a step-and-scan tool) the mask table MT may just be connected to a short stroke actuator, or may be fixed.

The depicted tool can be used in two different modes:

In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made to the invention as described without departing from the scope of the claims set out below.

The invention claimed is:

1. A method for simulating aspects of a lithographic process, comprising:
   securing data regarding characteristics of a lithographic apparatus;
   providing non-secure data about the lithographic process, wherein the non-secure data are not hidden;
   generating mathematical models representing the secured data and the non-secure data, wherein the secure data are encapsulated using a transformation function; and
   providing the mathematical models to a simulation process while keeping the secured data hidden to the simulation process, thereby allowing the simulation process to be performed using the mathematical models and without the simulation process having access to the secured data which is kept hidden from the simulation process by having been encapsulated using the transformation function into the mathematical models,
   wherein the transformation function includes computing one or more transmission cross coefficients (TCCs) comprising a plurality of eigen-systems representing the lithographic apparatus, and
   wherein the simulation process uses the mathematical models to form a simulated image corresponding to an actual image of the lithographic process, the actual image being an image as if produced by projecting a portion of a mask layout onto a substrate using the lithographic apparatus.

2. The method according to claim 1, wherein the one or more TCCs are computed based on characteristics of Diffractive Optical Element (DOE) selected from a library of standard illumination conditions.

3. The method according to claim 1, wherein a partial coherence formulation is used compute the plurality of eigen-systems into which the TCCs are decomposed, each eigen-system having a corresponding set of eigenvectors and eigenvalues.

4. The method according to claim 1, wherein generating the mathematical models includes selecting dominant ones of the eigen-systems to be provided to the simulation process.

5. A method for simulating aspects of a lithographic process, comprising:
   providing information on one or more optical components, one or more optical properties, or both of a lithographic apparatus;
   encapsulating the information of the one or more optical components by using a transformation function, wherein the transformation function secures the information on the one or more optical components;
   providing further information about the lithographic process; and
   providing the encapsulated information and the further information to a simulation process to simulate the lithographic process, thereby allowing the simulation process to be performed using the encapsulated information and without the simulation process having access to the secured information on the one or more optical components which is kept hidden from the simulation process by having been encapsulated using the transformation function into the encapsulated information, wherein the transformation function includes computing one or more transmission cross coefficients (TCCs) comprising a plurality of eigen-systems representing the lithographic apparatus, and wherein the simulation process uses the encapsulated information and the further information to form a simulated image corresponding to an actual image of the lithographic process, the actual image being an image as if produced by projecting a portion of a mask layout onto a substrate using the lithographic apparatus.

6. The method according to claim 5, wherein the information that is secured by the transformation function is unavailable to a user of the simulation process.

7. The method according to claim 5, wherein the one or more optical components include a illumination system, a projection system or both of the lithographic apparatus.

8. The method according to claim 5, wherein the one or more optical properties include illuminator shape and polarization, Jones pupil, focus blur due to laser bandwidth, focus blur due to chromatic aberrations.

9. The method according to claim 5, wherein the computed transmission cross coefficients are applied to a source-mask simulation process to determine process quality metrics of predicted contours of a mask layout data file.

10. The method according to claim 9, wherein the process quality metrics include one or more of normalized image log slope, mask error factor, and process window.

11. The method according to claim 5, wherein the one or more TCCs are computed based on characteristics of Diffractive Optical Element (DOE) selected from a library of standard illumination conditions.

12. The method according to claim 5, wherein a partial coherence formulation is used compute the plurality of eigen-systems into which the TCCs are decomposed, each eigen-system having a corresponding set of eigenvectors and eigenvalues.

13. A method for simulating aspects of a lithographic process, comprising:
generating a model for simulating the aspects of the lithographic process;
inputting information about a plurality of characteristics of a lithographic apparatus used in the lithographic process to the model; and
using the model to transform the information into transformed information with a transformation function of which the inverse is indeterminate given the transformed information only,
wherein the model allows obtaining the simulated aspects based on the transformed information and further information about other aspects of the lithographic process, thereby allowing the simulation to be performed using the model and without the simulation process having access to the information about the plurality of characteristics of the lithographic process which is kept hidden from the simulation process by having been transformed using the transformation function into the model, and wherein the transformation function includes computing transmission cross coefficients (TCCs) comprising a plurality of eigen-systems representing the lithographic apparatus, and
wherein the simulation process uses the model to form a simulated image corresponding to an actual image of the lithographic process, the actual image being an image as if produced by projecting a portion of a mask layout onto a substrate using the lithographic apparatus.

14. The method according to claim 13, wherein the plurality of characteristics comprises at least one of illuminator shape, illuminator polarization, Jones pupil and focus blur.

15. The method according to claim 13, wherein the further information comprises information on the layout of a pattern on a patterning means.

16. The method according to claim 13, wherein the simulated aspects comprise at least one of aerial image intensity, normalized image log slope, mask error factor and process window.

17. The method according to claim 13, wherein the transformation function is independent of the further information.

18. The method according to claim 13, wherein the TCCs are computed based on characteristics of Diffractive Optical Element (DOE) selected from a library of standard illumination conditions.

19. The method according to claim 13, wherein a partial coherence formulation is used compute the plurality of eigen-systems into which the TCCs are decomposed, each eigen-system having a corresponding set of eigenvectors and eigenvalues.

* * * * *